(12) United States Patent
Iguchi et al.

(10) Patent No.: US 6,551,925 B2
(45) Date of Patent: Apr. 22, 2003

(54) METHOD OF FORMING A TRENCH ISOLATION STRUCTURE RESISTANT TO HOT PHOSPHORIC ACID BY EXTENDING TRENCH LINER TO SHOULDER PORTIONS

(75) Inventors: Souichirou Iguchi, Shiga (JP); Takayuki Watanabe, Shiga (JP); Junji Kiyono, Shiga (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 09/916,429

(22) Filed: Jul. 27, 2001

(65) Prior Publication Data
US 2002/0064943 A1 May 30, 2002

(30) Foreign Application Priority Data
Jul. 28, 2000 (JP) ........................................ 2000-228464

(51) Int. Cl.[7] ........................................... H01L 21/4763
(52) U.S. Cl. ....................................... 438/637; 438/294
(58) Field of Search .................................. 438/296, 424, 438/637, 639, 645, 696, 294, 452, 671

(56) References Cited

U.S. PATENT DOCUMENTS

| | | | |
|---|---|---|---|
| 5,447,884 A | | 9/1995 | Fahey et al. |
| 5,763,315 A | | 6/1998 | Benedict et al. |
| 6,228,727 B1 | * | 5/2001 | Lim et al. |
| 6,331,469 B1 | * | 12/2001 | Park et. al. |

* cited by examiner

Primary Examiner—David Nelms
Assistant Examiner—Phuc T. Dang
(74) Attorney, Agent, or Firm—Katten Muchin Zavis Rosenman

(57) ABSTRACT

A trench isolation structure is fabricated on a silicon substrate by initially depositing a masking layer of nitride having an aperture. A spacer of oxide is then formed on the inner sidewall of the aperture to define a mask window. A trench is formed in the substrate by etching it through the mask window. The spacer is removed to form stepped shoulder portions on upper edges of the trench. A liner of thermal oxide is provided in the trench, followed by deposition of a liner of nitride on an area including the trench and the stepped shoulder portions. The trench is filled with silicon oxide, and the layer of nitride is etched away with hot phosphoric acid.

13 Claims, 5 Drawing Sheets

METHOD OF FORMING A TRENCH ISOLATION STRUCTURE RESISTANT TO HOT PHOSPHORIC ACID BY EXTENDING TRENCH LINER TO SHOULDER PORTIONS

BACKGROUND OF THE INVENTION

1. Field of the Invention

The present invention relates to a method of forming a trench isolation structure on a silicon substrate, where the trench is lined with silicon nitride.

2. Description of the Related Art

Shallow trench isolation structures are used to isolate circuit elements on an LSI chip. The sidewalls of the trenches are lined with silicon nitride to relief the stress caused by oxidation before the trenches are filled with a silicon dioxide filler. FIGS. 1A to 1G illustrate a number of steps currently used to form a shallow trench isolation structure. On a silicon substrate 1 a pad oxide layer 2 and a pad nitride layer 4 are sequentially deposited and through an aperture of resist 6 the layers 2 and 4 are anisotropically etched (FIG. 1A). After removing the resist 6, the pad nitride layer 4 is used as a mask for etching the silicon substrate 1 to form a trench 8 (FIG. 1B). In a thermal oxidation step, the inside of the trench is coated with a thermal oxide liner 10 to relief the damage produced during the trench formation. The wafer is then coated with a silicon nitride liner 12 (FIG. 1C). Silicon dioxide is then deposited on the wafer to fill the trench 8 with a filler 14 (FIG. 1D). Silicon dioxide filler 14 is densified by subjecting the wafer to an annealing process and the wafer is planarized by the CMP or etchback method until the silicon nitride liner 12 or pad nitride layer 4 is exposed (FIG. 1E). Hot phosphoric acid is used to remove the pad nitride layer 4 (FIG. 1F). Finally, hydrofluoric acid is used to remove the pad oxide layer 2 and a portion of the filler 14 that lies above the surface of the substrate 1 (FIG. 1G).

However, when the pad nitride layer 4 is removed by hot phosphoric acid, the acid penetrates down along the silicon nitride liner 12 and produces an unacceptable recess 16 as shown in FIG. 1F. As a result, when the surplus portion of the filler 14 is removed, the hydrofluoric acid penetrates through the recess 16 and produces a recess 18 in the filler 14 as shown in FIG. 1G.

In order to solve these problems, Fahey et al. U.S. Pat. No. 5,447,884 discloses that the silicon nitride liner 12 has a thickness less than 5 nm. However, Benedict et al. U.S. Pat. No. 5,763,315 discloses that if the silicon nitride liner 12 is deposited equal to or less than 4 nm in thickness, the liner is not an effective $O_2$ diffusion barrier and defects are readily formed in the trench capacitor array.

SUMMARY OF THE INVENTION

It is therefore an object of the present invention to provide an improved method of forming a trench isolation structure resistant to hot phosphoric acid without restrictions on the thickness of silicon nitride liner.

The stated object is obtained by introducing lateral component to the hot phosphoric acid penetration on the shoulder portions of the trench structure so that when the stripping process is complete the head of the lateral penetration stops short of the upper edges of the silicon nitride liner.

According to a first aspect of the present invention, there is provided a method of forming a trench isolation structure in a silicon substrate, comprising the steps of depositing a masking layer of nitride having an aperture on the substrate, forming a spacer of oxide on inner sidewall of the aperture to define a mask window, etching the substrate through the mask window to form a trench, removing the spacer to form stepped shoulder portions on upper edges of the trench, thermally depositing a liner of oxide in the trench, depositing a liner of nitride on an area including the trench and the stepped shoulder portions, depositing an isolation filler of oxide in the trench, and etching the layer of nitride with hot phosphoric acid.

According to a second aspect, the present invention provides a method of forming a trench isolation structure in a silicon substrate, comprising the steps of depositing a layer of nitride on the substrate and a masking layer of oxide on the layer of nitride so that the layers have a conformal aperture, forming a spacer of oxide on inner sidewall of the conformal aperture to define a mask window, etching the substrate trough the mask window to form a trench, removing the spacer and the masking layer to form stepped shoulder portions on upper edges of the trench, thermally depositing a liner of oxide in the trench, depositing a liner of nitride on an area including the trench and the stepped shoulder portions, depositing an isolation filler of oxide in the trench, and etching the layer of nitride with hot phosphoric acid.

BRIEF DESCRIPTION OF THE DRAWINGS

The present invention will be described in detail further with reference to the following drawings, in which.

DETAILED DESCRIPTION

Figure 2A:
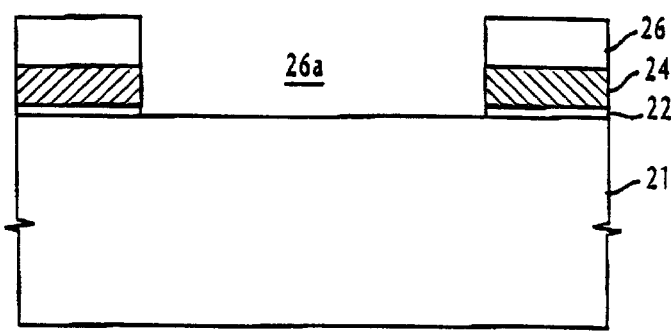
FIGS. 2A to 2H are cross-sectional views of a portion of a semiconductor wafer for illustrating steps of fabricating a shallow trench isolation structure on a silicon substrate according to a first embodiment of the present invention.

Referring to FIGS. 2A to 2H, there is shown a number of steps for producing a shallow trench isolation structure according to a first embodiment of the present invention. FIG. 2A illustrates a portion of a silicon substrate 21 where a shallow trench will be formed. On the silicon substrate 21 is a pad oxide (silicon dioxide) layer 22 of thickness 5 to 20 nm formed by the conventional thermal oxidation method. The known CVD method is then used to create a pad nitride (silicon nitride) layer 24 of thickness 100 to 300 nm on the pad oxide layer 22. On the pad nitride layer 24 is a patterned resist 26 having an aperture greater than the area in which a trench is to be formed. Anisotropic dry etching method is used to remove portions of the pad oxide layer 22 and pad nitride layer 24 until a portion of the substrate 21 is exposed to the outside through the aperture, forming an aperture 26a. The patterned resist 26 is then stripped and a silicon dioxide layer is deposited over the wafer.

Figure 2B:
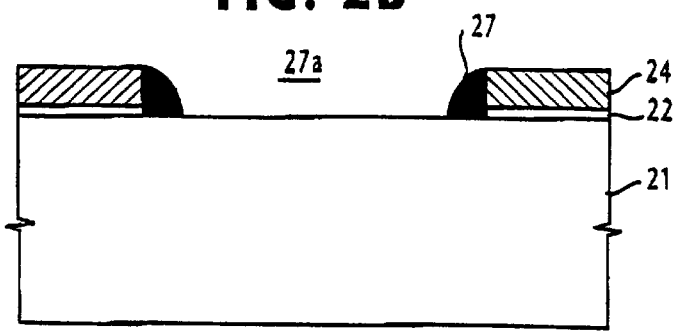

FIG. 2B illustrates the results of an etchback step of anisotropically etching that silicon dioxide layer so that a portion of it remains attached to the sidewall of aperture 26a as a spacer 27, which defines a mask window 27a. This mask window defines the area in which an isolation trench will be formed. If the width of aperture 26a is 200 nm, the spacer 27 has a maximum wall thickness of 100 nm, preferably 30 to 80 nm.

Figure 2C:
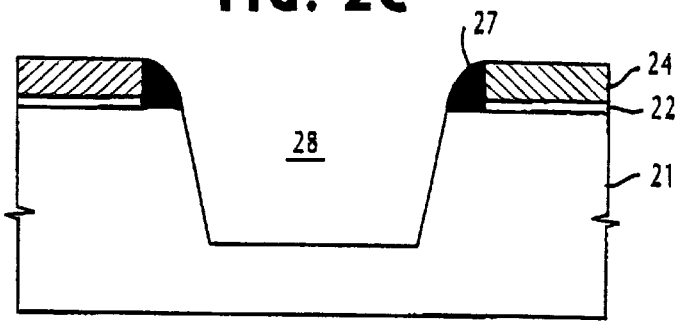

FIG. 2C illustrates the results of an anisotropic dry-etching step of the silicon substrate 21 for anisotropically etching the substrate through the mask window 26a to a depth of 200 to 500 nm to form a trench 28. In this instance, the silicon nitride layer 24 and the silicon dioxide spacer 27 act as a mask. Preferably, the wafer is subjected to a leaning process using diluted hydrofluoric acid, followed by a drying process using the low pressure IPA (isopropyl alcohol) method. These processes eliminate foreign matters and natural oxides which may remain on the surface of the substrate so that no silicon residues remain in the trench after the dry-etching process. Silicon dioxide spacer 27 is then removed using a solution containing hydrofluoric acid to form stepped shoulder portions on the upper edges of the trench 28.

Figure 2D:
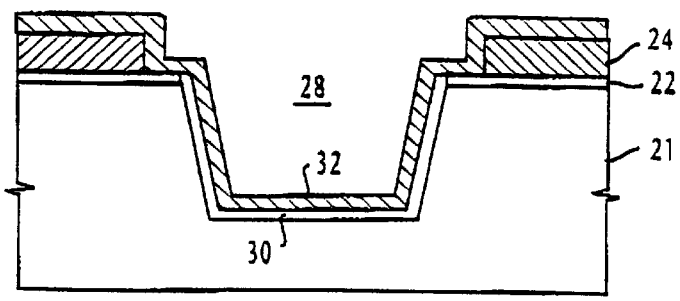

The wafer is then subjected to a thermal oxidation step to form a silicon dioxide liner 30 of thickness 5 to 15 nm, as shown in FIG. 2D, to remove the damage on the sidewalls of the trench produced when the trench was formed. The thermal oxidation process is followed by a chemical vapor deposition (CVD) process whereby the wafer is coated with a silicon nitride liner 32 of thickness equal to or greater than 5 nm. It is seen that the silicon nitride liner 32 is deposited over the stepped shoulder portions of trench 28 where the spacer 27 was present.

Figure 2E:
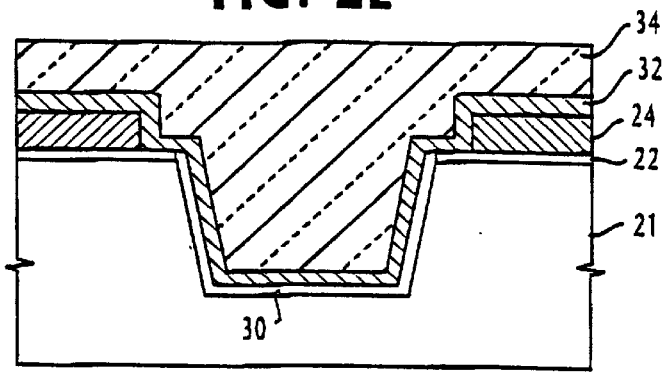

FIG. 2E shows the result of a CVD process of depositing a silicon dioxide filler 34 for isolation into the lined trench 28. The CVD process is followed by an annealing step for densifying the silicon nitride liner 32.

Figure 2F:
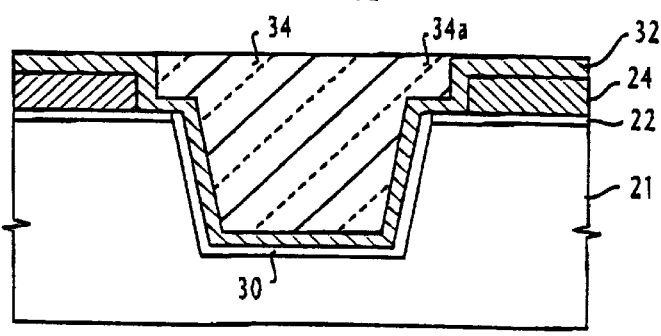

The wafer is then subjected to a CMP (chemical mechanical polishing) or an etchback process on the overfilling portion of the silicon dioxide filler 34 until upper portions of the silicon nitride liner 32 (or the silicon nitride layer 24) is exposed to the outside, as shown in FIG. 2F. Because of the shoulder portions of trench 28, the silicon dioxide filler 34 is shaped to form overhanging portions 34a and the pad nitride layer 24 has its edges positioned outwards of the trench 28.

Figure 1A:
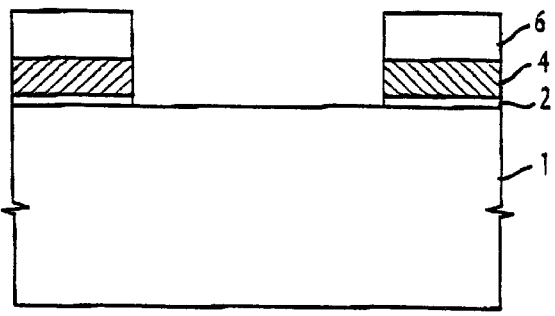
FIGS. 1A to 1G are cross-sectional views of a portion of a semiconductor wafer for illustrating conventional steps of fabricating a shallow trench isolation structure on a silicon substrate.
Figure 1B:
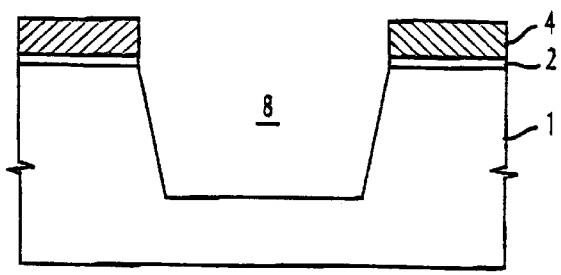
Figure 1C:
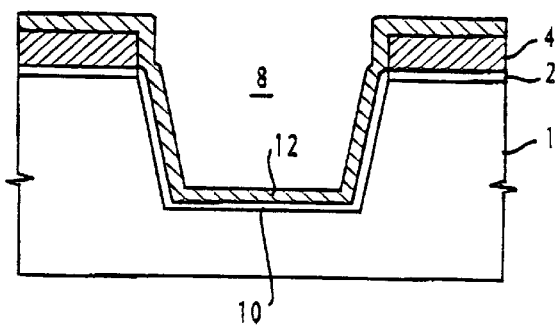
Figure 1D:
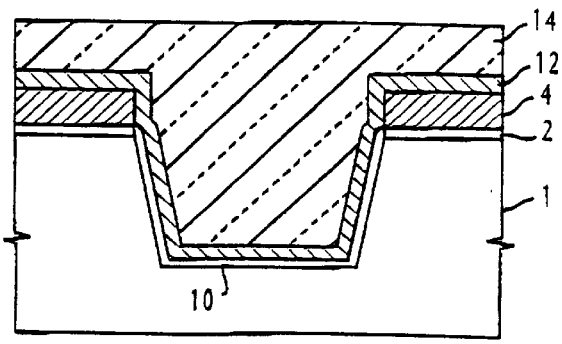
Figure 1E:
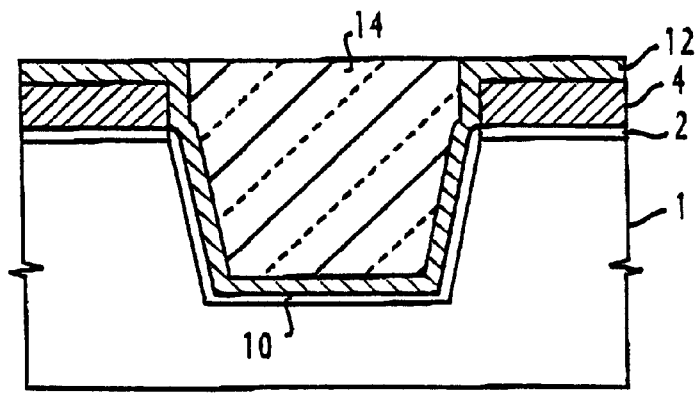
Figure 1F:
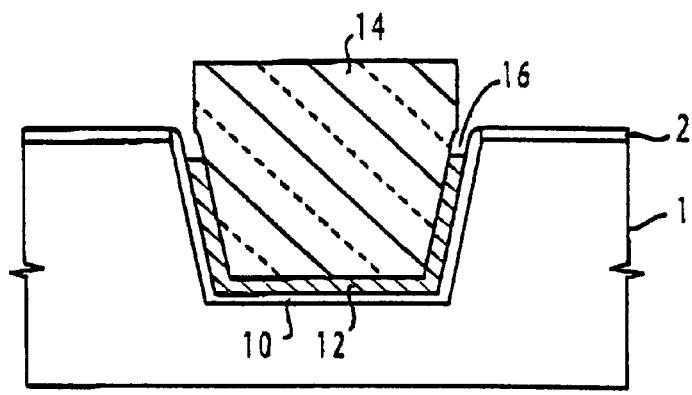
Figure 1G:
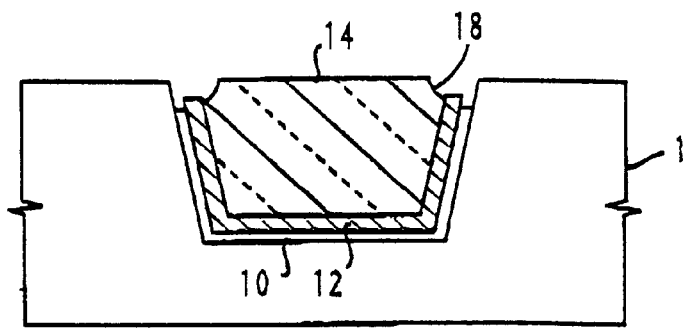
Figure 2G:
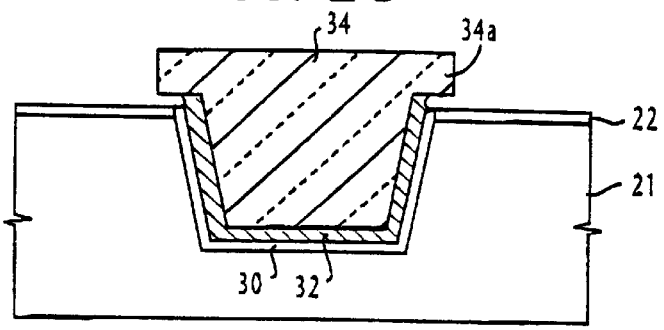

In a subsequent stripping process, the exposed portions of silicon nitride liner 32 and the pad nitride layer 24 are removed by using hot phosphoric acid, as shown in FIG. 2G. Since the nitride liner 32 extends some distance below the overhanging portions 34a, the hot phosphoric acid takes time to penetrate laterally below the overhanging portions 34a of the filler 34 toward the upper edge portions of the trench liner 32. Therefore, when the stripping process is complete, the head of the lateral penetration stops at a point short of the upper edges of the liner 32. This prevents the unacceptable recesses 16 and 18 shown in FIGS. 1F and 1G. To avoid this problem the prior art required that the thickness of the silicon nitride liner should be smaller than 5 nm. The present invention eliminates this requirement, allowing the silicon nitride liner 32 to be deposited in thickness which may be greater than 5 nm to prevent possible oxidation of the sidewalls of trench 28.

Figure 2H:
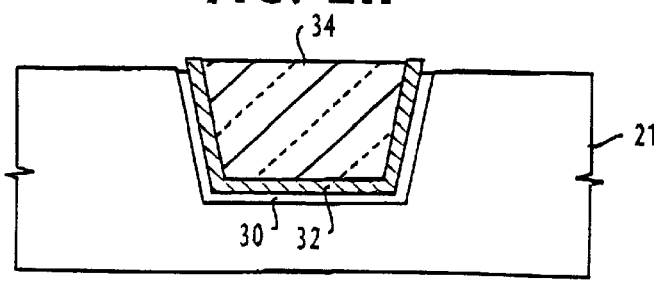

In a further stripping process, the pad oxide layer 22 and the portion of filler 34 that lies above the trench are removed by using hydrofluoric acid solution, as shown in FIG. 2H.

Since the maximum wall thickness of the spacer determines the lateral dimension of the stepped shoulder portions of the trench, it is desirable that the spacer's wall thickness can be controlled according to the size of a trench or other design factors.

Figure 3A:
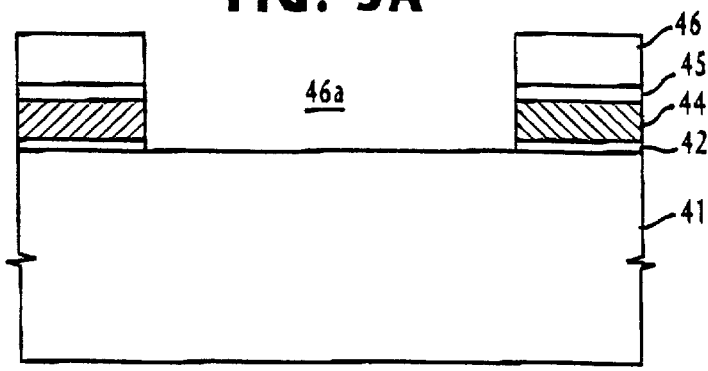
FIGS. 3A to 3D are cross-sectional views of a portion of a semiconductor wafer for illustrating steps of fabricating a shallow trench isolation structure on a silicon substrate according to a second embodiment of the present invention.

In FIGS. 3A to 3D, there is shown a number of steps for producing a shallow trench isolation structure according to a second embodiment of the present invention in which the spacer's wall thickness can be controlled. Similar to FIG. 2a, FIG. 3A illustrates a portion of a silicon substrate 41 where a shallow trench will be formed. On the silicon substrate 41 is a pad oxide (silicon dioxide) layer 42 of thickness 5 to 20 nm formed by the thermal oxidation method. A pad nitride (silicon nitride) layer 44 of thickness 100 to 300 nm is formed on the pad oxide layer 42. On the pad nitride layer 44 is a silicon dioxide layer 45 of thickness 30 to 60 nm. On the silicon dioxide layer 45 is a patterned resist 46 having an aperture greater than the area in which the trench is to be formed. Anisotropic dry etching method is used to remove portions of the pad oxide layer 42, pad nitride layer 44 and silicon dioxide layer 45 until a portion of the substrate 41 is exposed to the outside through the aperture, forming a recess 46a.

Figure 3B:
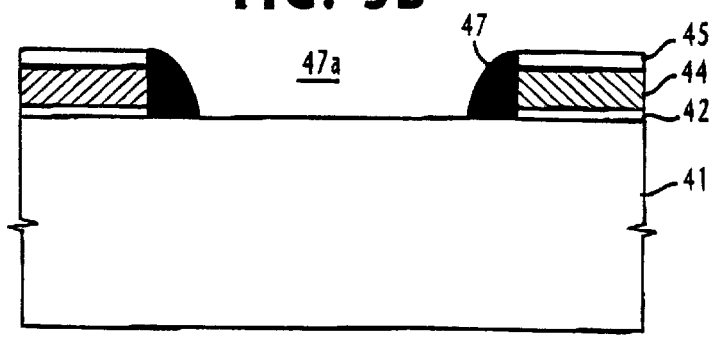

The patterned resist 46 is then stripped and a silicon dioxide layer is deposited over the wafer. This silicon dioxide layer is anisotropically etched until the silicon dioxide layer 45 is exposed. As a result, there remains a spacer 47 attached to the sidewall of recess 46b. Spacer 47 defines a mask window 47a. FIG. 3B illustrates the results of this anisotropically etching process. Depending on the thickness of the silicon dioxide layer 45, the spacer 47 has a desired maximum wall thickness.

Figure 3C:
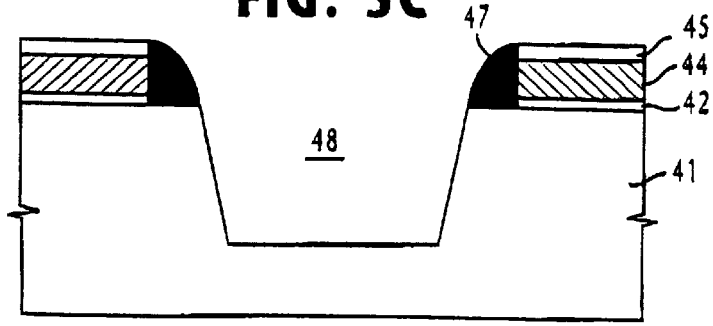

FIG. 3C illustrates the results of an anisotropic dry-etching step of the silicon substrate 41 for etching the substrate 41 through the mask window 47a to form a trench 48. Similar to the previous embodiment, during this etching process, the silicon dioxide layer 45 and the silicon dioxide spacer 47 serve as a mask. Silicon dioxide layer 45 and spacer 47 are then removed using hydrofluoric acid.

Figure 3D:
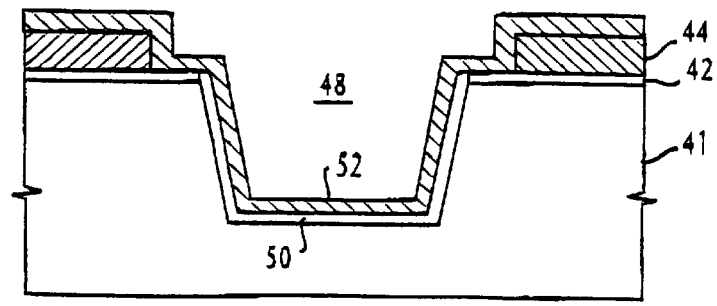

The wafer is then subjected to a thermal oxidation step to form a silicon dioxide liner 50 of thickness 5 to 15 nm, as shown in FIG. 3D, to stabilize the surface. The thermal oxidation process is followed by a CVD process for coating the wafer with a silicon nitride liner 52 of thickness equal to or greater than 5 nm.

Similar to the first embodiment, a silicon dioxide filler is deposited into the lined trench 48 and an annealing step is performed for densifying the silicon nitride liner 52. The wafer is then polished to remove the silicon dioxide filler until upper portions of the silicon nitride liner 52 are exposed to the outside and the portion of the filler that lies above the trench and the pad oxide layer 42 are removed by using hydrofluoric acid.

What is claimed is:

1. A method of forming a trench isolation structure in a silicon substrate, comprising the steps of;
    depositing a masking layer of nitride having an aperture on said substrate;
    forming a spacer of oxide on inner sidewall of said aperture to define a mask window;
    etching said substrate through said mask window to form a trench;
    removing said spacer to form stepped shoulder portions on upper edges of said trench;
    thermally depositing a liner of oxide in said trench;
    depositing a liner of nitride on an area including said trench and said stepped shoulder portions;
    depositing an isolation filler of oxide in said trench; and
    etching said layer of nitride with hot phosphoric acid.

2. The method of claim 1, wherein said masking layer of nitride comprises silicon nitride and said spacer comprises silicon dioxide.

3. The method of claim 2, wherein said spacer is formed by the steps of:
depositing a layer of silicon dioxide in the aperture of said layer of nitride; and
anisotropically etching said layer of silicon dioxide in an etchback process to leave a portion of the silicon dioxide layer on sidewall of said aperture as said spacer.

4. The method of claim 2, wherein said liner of nitride comprises silicon nitride.

5. The method of claim 2, wherein said liner of nitride has a thickness equal to or greater than 5 nm.

6. The method of claim 2, further comprising the steps of performing, prior to the step of forming said trench, a cleaning process using diluted hydrofluoric acid and a subsequent drying process.

7. A method of forming a trench isolation structure in a silicon substrate, comprising the steps of:
depositing a layer of nitride on said substrate and a masking layer of oxide on said layer of nitride, said layers having a conformal aperture;
forming a spacer of oxide on inner sidewall of said conformal aperture to define a mask window;
etching said substrate through said mask window to form a trench;
removing said spacer and said masking layer to form stepped shoulder portions on upper edges of said trench;
thermally depositing a liner of oxide in said trench;
depositing a liner of nitride on an area including said trench and said stepped shoulder portions;
depositing an isolation filler of oxide in said trench; and
etching said layer of nitride with hot phosphoric acid.

8. The method of claim 7, wherein said layer of nitride comprises silicon nitride, and said masking layer of oxide and said spacer comprise silicon dioxide.

9. The method of claim 8, wherein said spacer is formed by the steps of:
depositing a layer of silicon dioxide in said conformal aperture; and
anisotropically etching said layer of silicon dioxide in an etchback process to leave a portion of the silicon dioxide layer on sidewall of said conformal aperture as said spacer.

10. The method of claim 8, wherein said liner of nitride comprises silicon nitride.

11. The method of claim 8, further comprising the steps of performing, prior to the step of forming said trench, a cleaning process using diluted hydrofluoric acid and a subsequent drying process.

12. A method of forming a trench isolation structure in a silicon substrate, comprising the steps of:
a) depositing a silicon dioxide layer on said silicon substrate and a silicon nitride layer on said silicon dioxide layer and anisotropically etching said layers through a resist pattern to form an aperture;
b) depositing a silicon dioxide layer in said aperture and anisotropically etching the silicon dioxide layer in an etchback process to form a spacer on sidewall of said aperture so that a mask window is defined by said spacer;
c) anisotropically etching said silicon substrate through said window to form a trench;
d) removing said spacer to form stepped shoulder portions on upper edges of said trench, depositing silicon dioxide in a thermal oxidation process to cover said isolation trench and said stepped shoulder portions with a silicon dioxide liner, and depositing a silicon nitride liner on an area including said trench and said stepped shoulder portions;
e) depositing silicon dioxide on an area including said trench and the lined stepped shoulder portions until said trench is filled with a silicon dioxide filler;
f) performing an etching process until said silicon nitride liner or said silicon nitride layer is exposed to the outside; and
g) performing an etching process by using hot phosphoric acid until said silicon nitride layer is removed.

13. A method of forming a trench isolation structure in a silicon substrate, comprising the steps of:
a) depositing a first, silicon dioxide layer on said silicon substrate, a second, silicon nitride layer on said first layer and a third, silicon dioxide layer on said second layer and anisotropically etching said first, second and third layers through a resist pattern to form an aperture;
b) depositing a silicon dioxide layer in said aperture and anisotropically etching the silicon dioxide layer in an etchback process to form a spacer on sidewall of said aperture so that a mask window is defined by said spacer;
c) anisotropically etching said silicon substrate through said window to form a trench;
d) removing said spacer and said third layer of silicon dioxide to form stepped shoulder portions on upper edges of said trench, depositing silicon dioxide in a thermal oxidation process to cover said isolation trench and said stepped shoulder portions with a silicon dioxide liner, and depositing a silicon nitride liner on an area including said trench and said stepped shoulder portions;
e) depositing silicon dioxide on an area including said trench and the lined stepped shoulder portions until said trench is filled with a silicon dioxide filler;
f) performing an etching process until said silicon nitride liner or said second layer of silicon nitride is exposed to the outside; and
g) performing an etching process by using hot phosphoric acid until said silicon nitride layer is removed.

* * * * *